US012720877B2

(12) United States Patent
Ho et al.

(10) Patent No.: US 12,720,877 B2
(45) Date of Patent: Aug. 25, 2026

(54) VERSATILE ANTI-AMBIPOLAR PHOTOTRANSISTORS BASED ON MIXED-DIMENSIONAL HETEROJUNCTIONS

(71) Applicant: City University of Hong Kong, Hong Kong (CN)

(72) Inventors: Chung Yin Johnny Ho, Hong Kong (CN); Wei Wang, Hong Kong (CN); Weijun Wang, Hong Kong (CN); You Meng, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 427 days.

(21) Appl. No.: 18/146,150

(22) Filed: Dec. 23, 2022

(65) Prior Publication Data

US 2024/0213391 A1 Jun. 27, 2024

(51) Int. Cl.

| | |
|---|---|
| ***H10F 30/282*** | (2025.01) |
| ***H10F 10/16*** | (2025.01) |
| ***H10F 71/00*** | (2025.01) |
| ***H10F 77/12*** | (2025.01) |
| ***H10F 77/124*** | (2025.01) |
| ***H10F 77/14*** | (2025.01) |

(52) U.S. Cl.

CPC ........... *H10F 30/282* (2025.01); *H10F 10/16* (2025.01); *H10F 71/00* (2025.01); *H10F 77/12* (2025.01); *H10F 77/1248* (2025.01); *H10F 77/1433* (2025.01); *H10F 77/1437* (2025.01)

(58) Field of Classification Search

CPC .. H10F 77/12; H10F 77/1248; H10F 77/1437; H10F 77/143; H10F 30/245

See application file for complete search history.

(56) References Cited

PUBLICATIONS

Tang et al. "GaN Nanowire/Nb-Doped MoS2 Nanoflake Heterostructures for Fast UV-Visible Photodetectors," ACS Applied Nano Materials 2022 5 (3), 4515-4523 DOI: 10.1021/acsanm.2c00761 (Year: 2022).*

Wang et al Mixed-Dimensional Anti-ambipolar Phototransistors Based on 1D GaAsSb/2D MoS2 Heterojunctions, ACS Nano 2022 16 (7), 11036-11048 DOI: 10.1021/acsnano.2c03673 (Year: 2022).*

Paul, A. K. et al., "Photo-Tunable Transfer Characteristics in MoTe2-MoS2 Vertical Heterostructure," Nature Partner Journals, vol. 1, No. 17, Jun. 2017.

Prasai, D. et al., "Electrical Control of Near-Field Energy Transfer between Quantum Dots and Two-Dimensional Semiconductors," Nano Letters, vol. 15, No. 7, pp. 4374-4380, Jun. 2015.

(Continued)

*Primary Examiner* — Matthew L Reames

(74) *Attorney, Agent, or Firm* — Heslin Rothenberg Farley & Mesiti P.C.; Jacquelyn Graff, Esq.

(57) ABSTRACT

Mixed-dimensional heterostructure nano-devices with multi-functionality for use in semiconductors. Specifically, a gate-tunable and anti-ambipolar phototransistor is devised based on 1D p-type GaAsSb nanowire/2D n-type $MoS_2$ nanoflake mixed-dimensional van der Waals (vdW) heterojunctions. Methods of making the mixed-dimensional heterostructure nano-devices with multi-functionality, gate-tunability and anti-ambipolar phototransistor.

20 Claims, 10 Drawing Sheets

(56) References Cited

PUBLICATIONS

Qian, X. F. et al., "Quantum Spin Hall Effect in Two-Dimensional Transition Metal Dichalcogenides," Science, vol. 346, No. 6215, pp. 1344-1347, Dec. 2014.
Ren, F. F. et al., "Split Bull's Eye Shaped Aluminum Antenna for Plasmon-Enhanced Nanometer Scale Germanium Photodetector," Nano Letters, vol. 11, No. 3, pp. 1289-1293, Feb. 2011.
Rezaei, M. et al., "A New Approach to Designing High-Sensitivity Low-Dimensional Photodetectors," Nano Letters, vol. 21, No. 23, pp. 9838-9844, Nov. 2021.
Sangwan, V. K. et al., "Electronic Transport in Two-Dimensional Materials," Annual Review of Physical Chemistry, vol. 69, pp. 299-325, Feb. 2018.
Santos, E. J. G. et al., "Electrically Driven Tuning of the Dielectric Constant in MoS2 Layers," ACS Nano, vol. 7, No. 12, pp. 10741-10746, Nov. 2013.
Shim, J. et al., "Light-Triggered Ternary Device and Inverter Based on Heterojunction of van der Waals Materials," ACS Nano, vol. 11, No. 6, pp. 6319-6327, Jun. 2017.
Shokouh, S. H. H. et al., "High-Gain Subnanowatt Power Consumption Hybrid Complementary Logic Inverter with WSe2 Nanosheet and ZnO Nanowire Transistors on Glass," Advanced Materials, vol. 27, pp. 150-156, 2015.
Siegel, G. et al., "Growth of Centimeter-Scale Atomically Thin MoS2 Films by Pulsed Laser Deposition," APL Mater. vol. 3, pp. 056103-056103-7, May 2015.
Snaith, H. J. et al., "Light Intensity, Temperature, and Thickness Dependence of the Open-Circuit Voltage in Solid-State Dye-Sensitized Solar Cells," Physical Review B, vol. 74, p. 045306-1-045306-6, Jul. 2006.
Sun, G. Z. et al., "Direct van der Waals Epitaxial Growth of 1D/2D Sb2Se3/WS2 Mixed-Dimensional p-n Heterojunctions," Nano Research, vol. 12, No. 5, pp. 1139-1145, Feb. 2019.
Tan, C. Y. et al., "Broken-Gap PtS2/WSe2 van der Waals Heterojunction with Ultrahigh Reverse Rectification and Fast Photoresponse," ACS Nano, vol. 15, No. 5, pp. 8328-8337, Mar. 2021.
Tran, T. U. et al., "Gate Tunable Photoresponse of a Two-Dimensional p-n Junction for High Performance Broadband Photodetector," Applied Materials Today, vol. 26, pp. 101285-1-101285-9, 2022.
Wakayama, Y. et al., "Antiambipolar Transistor: A Newcomer for Future Flexible Electronics," Advances Functional Materials, vol. 30, pp. 1903724-1-1903724-11, May 2020.
Wang, K. C. et al., "Atomic-Level Charge Transport Mechanism in Gate-Tunable Anti-Ambipolar van der Waals Heterojunctions," Applied Physics Letters, vol. 118, No. 8, pp. 083103-083103-5, Feb. 2021.
Wang, P. et al., "Arrayed van der Waals Broadband Detectors for Dual-Band Detection," Advanced Materials, vol. 29, pp. 1604439-1-1604439-8, Apr. 2017.
Wang, W. et al., "Antimony-Rich GaAsx-Sb1-x Nanowires Passivated by Organic Sulfides for High-Performance Transistors and Near-Infrared Photodetectors," Advanced Optical Materials, vol. 9, pp. 2101289-1-2101289-13, Sep. 2021.
Li, D. H. et al., "Electric-Field-Induced Strong Enhancement of Electroluminescence in Multilayer Molybdenum Disulfide," Nature Communication, vol. 6, No. 7509, pp. 1-8, Jul. 2015.
Wang, Z. W. et al., "Hybrid van der Waals p-n Heterojunctions based on SnO and 2D MoS2," Advanced Materials, vol. 28, pp. 9133-9141, 2016.
Wu, F. et al., "AsP/InSe Van der Waals Tunneling Heterojunctions with Ultrahigh Reverse Rectification Ratio and High Photosensitivity," Advanced Functional Materials, vol. 29, pp. 1900314-1-1900314-9, Mar. 2019.
Wu, L. M. et al., "Atomically Sharp Interface Enabled Ultrahigh-Speed Non-Volatile Memory Devices," Nature Nanotechnology, vol. 16, pp. 882-887, Aug. 2021.
Wu, Y. et al., "A Monolayer Graphene/GaAs Nanowire Array Schottky Junction Self-Powered Photodetector," Applied Physics Letters, vol. 109, pp. 183101-183101-5, Oct. 2016.
Yang, H. et al., "Graphene Barristor, a Triode Device with a Gate-Controlled Schottky Barrier," Science, vol. 336, pp. 1140-1143, Jun. 2012.
Yang, T. F. et al., "Van der Waals Epitaxial Growth and Optoelectronics of Large-Scale WS32/SnS2 Vertical Bilayer p-n Junctions," Nature Communications, vol. 8, No. 1906, pp. 1-9, 2017.
Yao, H. et al., "Frequency Doubler Based on a Single MoTe2/MoS2 Anti-Ambipolar Heterostructure," Applied Physics Letters, vol. 117, No. 12, pp. 123103-123103-5, Sep. 2020.
Yi, S. G. et al., "Optoelectric Properties of Gate-Tunable MoS2/WSe2 Heterojunction," IEEE Transactions on Nanotechnology, vol. 15, pp. 499-505, May 2016.
Yin, J. B. et al., "Ultrafast and Highly Sensitive Infrared Photodetectors Based on Two-Dimensional Oxyselenide Crystals," Nature Communications, vol. 9, No. 3311, pp. 1-7, 2018.
Zhang, H. B. et al., "High-Responsivity, High-Detectivity, Ultrafast Topological Insulator Bi2Se3/Silicon Heterostructure Broadband Photodetectors," ACS Nano, vol. 10. No. 5, pp. 5113-5122, Apr. 2016.
Zhang, K. A. et al., "Interlayer Transition and Infrared Photodetection in Atomically Thin Type-II MoTe2/MoS2 van der Waals Heterostructures," ACS Nano, vol. 10, No. 3, pp. 3852-3858, Mar. 2016.
Zhao, Z. Y. et al., "Study of the Layer-Dependent Properties of MoS2 Nanosheets with Different Crystal Structures by DFT Calculations," Catalysis Science & Technology, vol. 8, pp. 1867-1879, 2018.
Zhou, J. Y. et al., "Mixed-Dimensional van der Waals Heterostructure Photodetector," ACS Applied Materials & Interfaces, vol. 12, No. 16, pp. 18674-18682, Mar. 2020.
Zhou, X. et al., "Tunneling Diode Based on WSe2/SnS2 Heterostructure Incorporating High Detectivity and Responsivity," Advanced Materials, vol. 30, pp. 1703286-1-1703286-8, 2018.
Adachi, S., "Optical Dispersion Relations for GaP, GaAs, GaSb, InP, InSb, AlxGa1-xAs, and In1-xGaxAsyP1-y," Journal of Applied Physics, vol. 66, No. 12, pp. 6030-6040, Dec. 1989.
Britnell, L. et al., "Filed-Effect Tunneling Transistor Based on Vertical Graphene Heterostructures," Science, vol. 335, pp. 947-950, Feb. 2012.
Chen, K. et al., Electronic Properties of MoS2-WS2 Heterostructures Synthesized with Two-Step Lateral Epitaxial Strategy, ACS Nano, vol. 9, No. 10, pp. 9868-9876, Sep. 2015.
Cheng, R. et al., "Electroluminescence and Photocurrent Generation from Atomically Sharp WSe2/MoS2 Heterojunction p-n Diodes," Nano Letters, vol. 14, No. 10, pp. 5590-5597, Aug. 2014.
Choi, W. et al., "High-Detectivity Multilayer MoS2 Phototransistors with Spectral Response from Ultraviolet to Infrared," Advanced Materials, vol. 24, No. 43, pp. 5832-5836, Nov. 2022.
Coehoorn, R. et al., "Electronic-Structure MoSe2, MoS2, and WSe2. I. Band-Structure Calculations and Photoelectron-Spectroscopy," Physical Review B, vol. 35, No. 12, pp. 6195-6202, Apr. 1987.
Coehoorn, R. et al., "Electronic-Structure of MoSe2, MoS2, and WSe2. II. The Nature of the Optical Band Gaps," Physical Review B, vol. 35, No. 12, pp. 6203-6206, Apr. 1987.
Furchi, M. M. et al., "Device Physics of van der Waals Heterojunction Solar Cells," Npj 2d Materials and Applications, vol. 2, No. 3, pp. 1-7, 2018.
Furchi, M. M. et al., "Photovoltaic Effect in an Electrically Tunable van der Waals Heterojunction," Nano Letters, vol. 14, pp. 4785-4791, Jul. 2014.
Garnett, E. et al., "Light Trapping in Silicon Nanowire Solar Cells," Nano Letters, vol. 10, pp. 1082-1087, Jan. 2010.
Geim, A. K. et al., "Van der Waals heterostructures," Nature, vol. 499, pp. 419-425, Jul. 2013.
Guo, Q. et al., "Black Phosphorus Mid-Infrared Photodetectors with High Grain," Nano Letters, vol. 16, pp. 4648-4655, Jun. 2016.
Han, N. "GaAs Nanowires: From Manipulation of Defect Formation to Controllable Electronic Transport Properties," ACS Nano. vol. 7, p. 9138-9146, Aug. 2013.

(56) References Cited

PUBLICATIONS

Hayne, M. et al., "Electron Localization by Self-Assembled GaSb/GaAs Quantum Dots," Applied Physics Letters, vol. 82, pp. 4355-4357, Jun. 2003.
Hong, X. P. et al., "Ultrafast Charge Transfer in Atomically Thin MoS2/WS2 Heterostructures," Nature Nanotechnology, vol. 9, pp. 682-686, Sep. 2014.
Hou, J. J. et al., "Stoichiometric Effect on Electrical Optical and Structural Properties of Composition-Tunable InxGa1-xAs Nanowires," ACS Nano, vol. 6, pp. 9320-9325, Sep. 2012.
Huo, N. J. et al., "Tunable Polarity Behavior and Self-Driven Photoswitching in p-WSe2/n-WS2 Heterojunctions," Small, vol. 11, pp. 5430-5438, 2015.
Huang, M. Q. et al., "Multifunctional High-Performance van der Waals Heterostructures," Nature Nanotechnology, vol. 12, pp. 1148-1154, Oct. 2017.
Inbaraj, C. R. P. et al, "A Bi-Anti-Ambipolar Field Effect Transistor," ACS Nano, vol. 15, pp. 8686-8693, May 2021.
Islam, A. et al., "Atomic Layer GaSe/MoS2 van der Waals Heterostructure Photodiodes with Low Noise and Large Dynamic Range," ACS Photonics, vol. 5, pp. 2693-2700, Jun. 2018.
Jariwala, D. et al., "Emerging Device Applications for Semiconducting Two-Dimensional Transition Metal Dichalcogenides," ACS Nano, vol. 8, pp. 1102-1120, Jan. 2014.
Jariwala, D. et al., "Gate-Tunable Carbon Nanotube-MoS2 Heterojunction p-n Diode," P. Natl. Acad. Sci., vol. 110, pp. 18076-18080, Nov. 2013.
Jariwala, D. et al., Hybrid, Gate-Tunable, van der Waals p-n Heterojunctions from Pentacene and MoS2, Nano Letters, vol. 16, pp. 497-503, Dec. 2015.
Jariwala, D. et al., "Large-Area, Low-Voltage, Antiambipolar Heterojunctions from Solution-Processed Semiconductors," Nano Letters, vol. 15, pp. 416-421, Dec. 2014.
Jastrzebski, L. et al., "Application of Scanning Electron-Microscopy to Determination of Surface Recombination Velocity: GaAs," Applied Physics Letters, vol. 27, pp. 537-539, Nov. 1975.
Jiang, X. X. et al., "A Symmetric Tunnel Field-Effect Transistor Based on MoS2/Black Phosphorus/MoS2 Nanolayered Heterostructures," ACS Applied Nano Materials, vol. 2, pp. 5674-5680, Jul. 2019.
Kang, Y. M. et al., "Monolithic Germanium/Silicon Avalanche Photodiodes with 340 GHz Gain-Bandwidth Product," Nature Photonics, vol. 3, pp. 59-63, Jan. 2009.
Kim, C. O. et al, "High Photoresponsivity in an All-Graphene p-n Vertical Junction Photodetector," Nature Communications, vol. 5, pp. 3249, Feb. 2014.
Kim, S. et al., "Location-Dependent Multi-Parameter Detection Behavior Using Hetero-Interfaced Organic Anti-Ambipolar Phototransistors," Sensors and Actuators A: Physical, vol. 330, pp. 112888, Oct. 2021.
Kim, S. et al., "Sensors and Actuators A: Physical," Elsevier B.V., vol. 330, pp. 2-8, Oct. 2011.
Kim, T. J. et al., "Parameterization of the Dielectric Function of GaAsSb Alloy Films," Journal of the Korean Physical Society, vol. 77, pp. 840-844, Nov. 2020.
Klee, V. et al., "Superliner Composition-Dependent Photocurrent in CVD-Grown Monolayer MoS2(1-x)Se2x Alloy Devices," Nano Letters, vol. 15, pp. 2612-2619, Feb. 2015.
Kufer, D. et al., "Highly Sensitive, Encapsulated MoS2 Photodetector with Gate Controllable Gain and Speed," Nano Letters, vol. 15, pp. 7307-7313, Oct. 2015.
Lee, C. et al., "Anomalous Lattice Vibrations of Single- and Few-Layer MoS2," ACS Nano, vol. 4, pp. 2695-2700, Apr. 2010.
Lee, H. S. et al., "Metal Semiconductor Field-Effect Transistor with MoS2/Conducting NiOx van der Waals Schottky Interface for Intrinsic High Mobility and Photoswitching Speed," ACS Nano, vol. 9, pp. 8312-8320, Jul. 2015.
Lee, Y. T. et al., "Mixed-Dimensional 1D ZnO-2D WSe2 van der Waals Heterojunction Device for Photosensors," Advanced Functional Materials, vol. 27, pp. 1703822-1-1703822-8, Nov. 2017.
Li, D. P. et al., "Ultra-Fast Photodetectors Based on High-Mobility Indium Gallium Antimonide Nanowires," Nature Communications, vol. 10, pp. 1664, Apr. 2019.
Li, D. et al., "Two-Dimensional Non-Volatile Programmable p-n Junctions," Nature Technology, vol. 12, pp. 901-906, Jun. 2017.
Li, L. X. et al., "Near Full-Composition-Range High Quality GaAs1-xSbx Nanowires Grown by Molecular-Beam Epitaxy," Nano Letters, vol. 17, pp. 622-630, Jan. 2017.
Li, L. et al., "Ternary Ta2NiSe5 Flakes for a High-Performance Infrared Photodetector," Advanced Functional Materials, vol. 26, pp. 8281-8289, Dec. 2016.
Li, N. N. et al., "Strongly Coupled van der Waals Heterostructures for High-Performance Infrared Phototransistor," Applied Physics Letters, vol. 114, pp. 103501-103501-5, Mar. 2019.
Li, Y. et al., "Anti-Ambipolar Field-Effect Transistors Based on Few-Layer 2D Transition Metal Dichalcogenides," ACS Applied Material & Interfaces, vol. 8, pp. 15574-15581, Jun. 2016.
Liao, F. Y. et al., "A Dual-Gate MoS2 Photodetector Based on Interface Coupling Effect," Small, vol. 16, pp. 1904369-1-1904369-7, Jan. 2020.
Liu, X. et al., "All-Printable Band-Edge Modulated ZnO Nanowire Photodetectors with Ultra-High Detectivity," Nature Communications, vol. 5, No. 4007, pp. 1-9, Jun. 2014.
Liu, Y. et al., "Toward Barrier Free Contact to Molybdenum Disulfide Using Graphene Electrodes," Nano Letters, vol. 15, pp. 3030-3034, Apr. 2015.
Luo, T. et al., "Single-GaSb-Nanowire-Based Room Temperature Photodetectors with Broad Spectral Response," Sci. Bull., vol. 60, No. 1, pp. 101-108, 2015.
Luong, D. H. et al., "Tunneling Photocurrent Assisted by Interlayer Excitons in Staggered van der Waals Hetero-Bilayers," Advanced Materials, vol. 29, pp. 1701512-1-1701512-8, 2017.
Mishra, U. K. et al., "Semiconductor Device Physics and Design," Springer: Dordrecht, 2008.
Neidert, R. E., "Dielectric Constant of Semi-Insulating Gallium Arsenide," Electronic Letters, vol. 16. pp. 244-245, Mar. 1980.
Palacios-Berraquero, C. et al., "Atomically thin quantum light-emitting diodes," Nature Communications, vol. 7, pp. 12978-1-12978-6, Sep. 2016.

* cited by examiner

VERSATILE ANTI-AMBIPOLAR PHOTOTRANSISTORS BASED ON MIXED-DIMENSIONAL HETEROJUNCTIONS

FIELD OF THE INVENTION

The present invention relates generally to semiconductors and mixed-dimensional heterostructure nano-devices with multi-functionality. More specifically, but not exclusively, the present invention concerns a gate-tunable and anti-ambipolar phototransistor is devised based on 1D p-type GaAsSb nanowire/2D n-type $MoS_2$ nanoflake mixed-dimensional van der Waals (vdW) heterojunctions.

BACKGROUND OF THE INVENTION

In the past decade, the emergence of 2D vdW heterostructures has expanded the possibility of diverse nanoscale functional devices through integrating the disparate materials with artificially stacked architecture. Prominent among these vdW nanodevices are the discovery of anti-ambipolar transistors, which could be deemed as deriving from the field-effect transistor (FET) channel composed of p-type and n-type semiconductors and p-n diode in series, as presented in FIG. 1*a*. It presents a convex shape transfer characteristics that the channel electrical conductance peaks at a specific gate bias, which is exactly distinct from the transfer curves of unipolar FETs and regular ambipolar devices (FIG. 1B). This special characteristic is quite advantageous to implement complicated electronic functions merely by a single device in logic circuits, optoelectronics and spiking neurons.

The anti-ambipolar transistors based on lateral p-n heterojunctions possess gate-tunable rectification characteristics, which can be used to develop gate-tunable rectifier circuits and photodiodes. Since the anti-ambipolar devices enable both positive and negative transconductance, the p/n-type components can be readily modulated by a capacitively coupled gate bias. Nevertheless, the studies of photodetection on such nanodevice geometries with external gate modulation are still largely lacking. This may be due to the challenging fabrication of anti-ambipolar heterodiodes with reliable and exceptional performances. First, the turn-on voltages ($V_{on}$) and carrier densities of both the p/n-type transistors should be precisely controlled. Second, it requires the limit of device dimensions and local gating. Last but not least, high-quality and strongly coupled heterointerface is also crucial to produce efficient charge transfer.

Here, a gate-tunable high-performance anti-ambipolar phototransistor based on 1D p-type III-V semiconductor nanowire/n-type 2D transition metal dichalcogenide (TMD) nanoflake heterojunctions has been first developed, as shown in FIGS. 2A-2B. The reduced dimensionality of GaAsSb nanowires (NWs) can distinctly decrease the active region in the heterostructures. Meanwhile, owing to the wave-guiding effect, NWs also play a functional role in light trapping to enhance light-to-current conversion efficiency substantially. In terms of unique physical properties of $MoS_2$, the nature of dangling-bond-free surface enables the formation of hybrid vdW heterostructures when integrated with differently dimensioned materials. And the high intrinsic carrier mobility of both integrated constituents has a beneficial effect on shortening the carrier-transit time within the heterostructure device channel. In general, the synergistic effect in the mixed-dimensional heterostructures would bring great significance in constructing anti-ambipolar optoelectronics with diverse functionalities.

The electronic performance of the heterojunction device was evaluated with the n-contact grounded. An obviously anti-ambipolar response could be observed from the transfer characteristics under a forward source-drain bias of 2 V (FIG. 3A), demonstrating the gate-tunability of the current through the p-n heterojunction. Meanwhile, the gate leakage current (below 40 pA) is negligible as compared with the channel current. The unique transfer characteristics results from the FET channel comprising of a p-type and n-type semiconductors in series, in which the total current reaches maximum when both transistors are turned on (near $V_{gs}$=−40 V) and declines to a minimum when either device is off ($V_{gs}$=−60 V and 40 V). As indicated from the optoelectronic performance in FIGS. 3*b* and *c*, with the optimum gate modulation ($V_{gs}$=−40 V), the heterostructure photodiode delivered a respectable performance with a responsivity of 11.7 A $W^{-1}$, a detectivity of $1.64\times10^{11}$ Jones and an EQE value of $2.74\times10^{3}$% at $V_{ds}$ of −2 V under 532 nm illumination. Importantly, the rise and decay times are as efficient as around 50 μs (FIG. 3D). All these results demonstrate the superiority and multi-functionality of the anti-ambipolar device structure consisting of p-type III-V semiconductor NW and n-type 2D TMD nanoflake FETs in series.

Thus, what is needed are anti-ambipolar transistors devised to have the potential application in three-terminal device units, including frequency doubling, binary phase shift keying, and ternary logic inverter, which can reduce the number of circuit elements and the circuit design compared to conventional FET technologies. In addition, what is needed is an anti-ambipolar device that can be utilized as a gate-tunable phototransistors, i.e., the optoelectronic properties can be well tailored by the external applied gate bias.

SUMMARY OF THE INVENTION

Aspects of the present invention provide a gate-tunable and anti-ambipolar phototransistor is devised based on 1D p-type GaAsSb nanowire/2D n-type $MoS_2$ nanoflake mixed-dimensional van der Waals (vdW) heterojunctions apparatus and a method for creating same.

In one aspect, provided herein is a mixed-dimensional heterojunction device, including at least one substrate layer, at least one nanowire positioned on a portion of the at least one substrate layer, at least one first contact positioned over at least a portion of the at least one substrate layer and at least a portion of the at least one nanowire, a nanoflake positioned on at least a portion of the at least one substrate layer and at least a portion of the at least one nanowire, and at least one second contact positioned on at least a portion of the at least one substrate layer and at least a portion of the nanoflake.

In another aspect, provided herein is method of mixed-dimensional heterojunction device including obtaining a substrate and obtaining a prepared nanowire. The method also including transferring the nanowire onto the substrate and depositing a first contact over the substrate and at least a portion of the nanowire. The method further includes forming nanoflake over a portion of the substrate and a portion of the nanowire and depositing a second contact over the substrate and at least a portion of the nanoflake.

These, and other objects, features and advantages of this invention will become apparent from the following detailed description of the various aspects of the invention taken in conjunction with the accompanying drawings.

BRIEF DESCRIPTION OF DRAWINGS

The accompanying drawings, which are incorporated in and constitute a part of the specification, illustrate embodiments of the invention and together with the detailed description herein, serve to explain the principles of the invention. The drawings are only for purposes of illustrating preferred embodiments and are not to be construed as limiting the invention. It is emphasized that, in accordance with the standard practice in the industry, various features are not drawn to scale. In fact, the dimensions of the various features may be arbitrarily increased or reduced for clarity of discussion. The foregoing and other objects, features and advantages of the invention are apparent from the following detailed description taken in conjunction with the accompanying drawings in which.

DETAILED DESCRIPTION FOR CARRYING OUT THE INVENTION

Figure 1A:
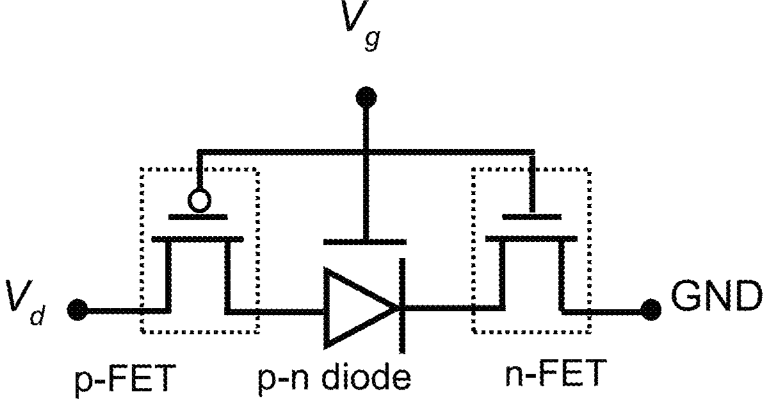
FIG. 1A is an electrical configuration of ant anti-ambipolar transistor, including p-type and n-type FETs and p-n diode in series, in accordance with an aspect of the present disclosure.
Figure 1B:
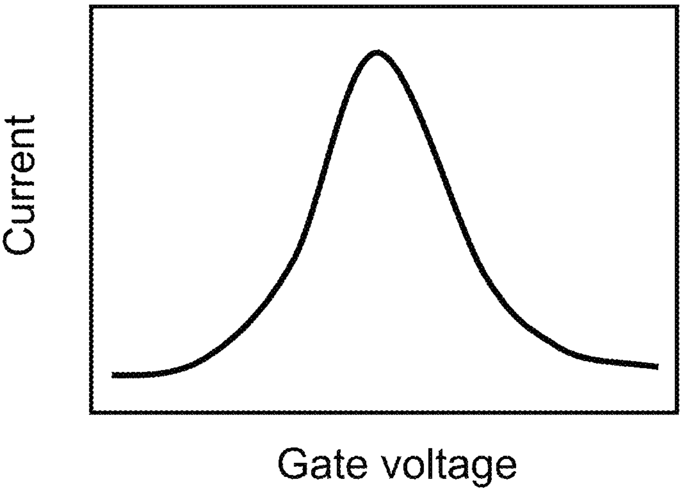
FIG. 1B is a schematic of transfer characteristics of anti-ambipolar transistors, in accordance with an aspect of the present disclosure.
Figure 2A:
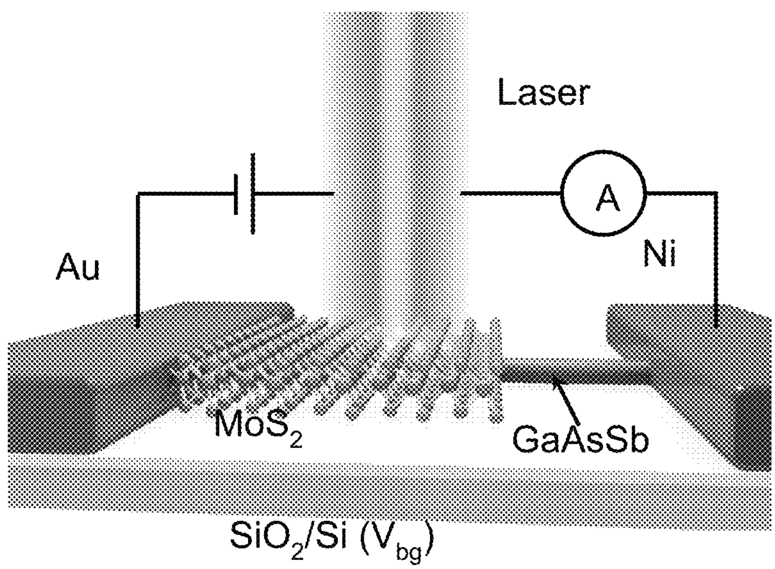
FIG. 2A is a schematic of the 1D GaAsSb nanowire/3D $MoS_2$ nanoflake anti-ambipolar phototransistor, in accordance with an aspect of the present disclosure.
Figure 2B:
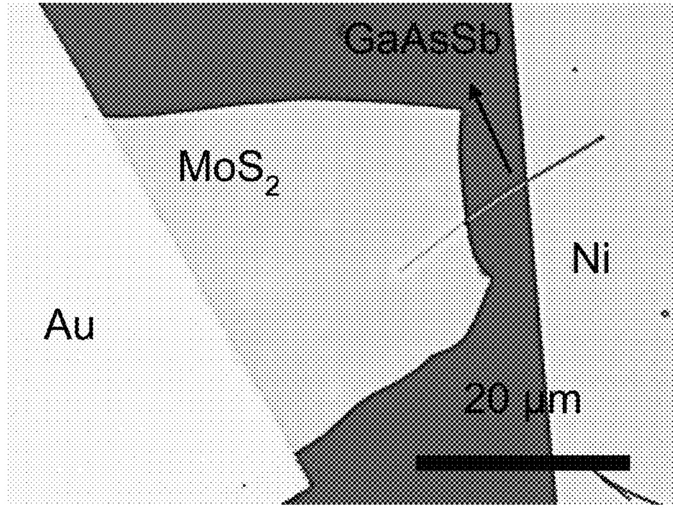
FIG. 2B is an optical image of the 1D GaAsSb nanowire/3D $MoS_2$ nanoflake anti-ambipolar phototransistor, in accordance with an aspect of the present disclosure.
Figure 3A:
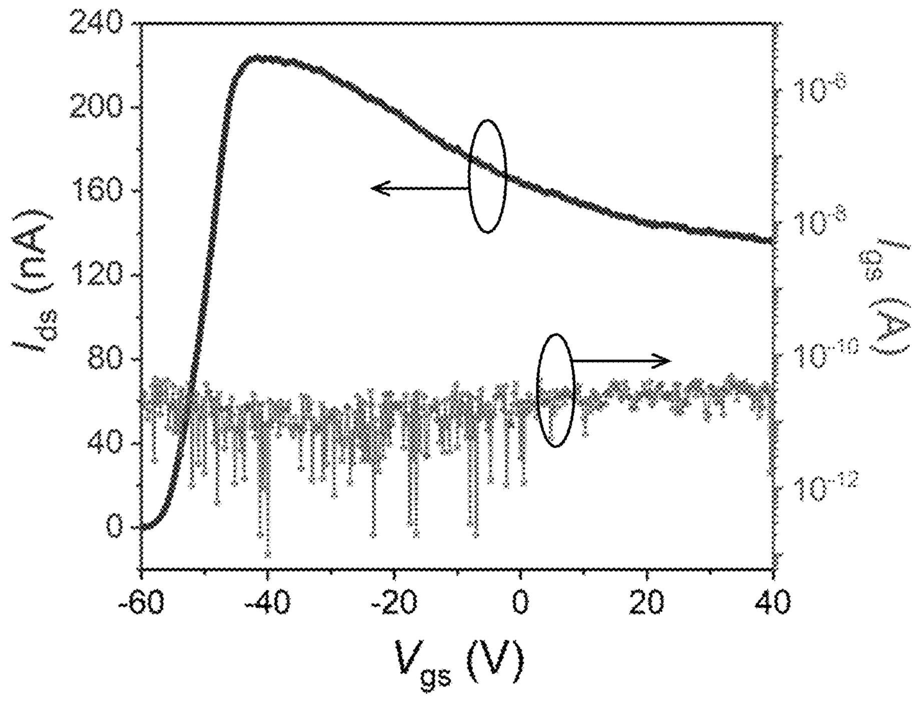
FIG. 3A is a graph of transfer characteristics of the 1D GaAsSb nanowire/2D $MoS_2$ nanoflake anti-ambipolar transistor, in accordance with an aspect of the present disclosure.
Figure 3B:
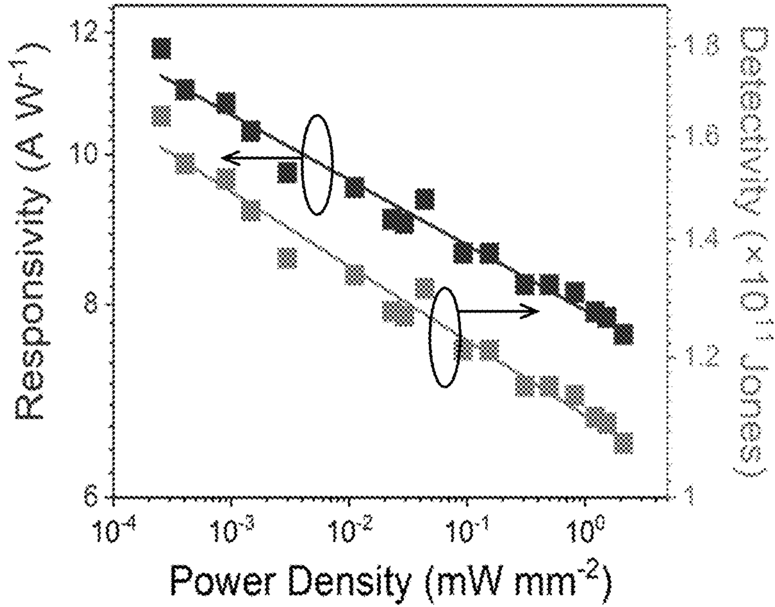
FIG. 3B is a graph of responsivity and detectivity, in accordance with an aspect of the present disclosure.
Figure 3C:
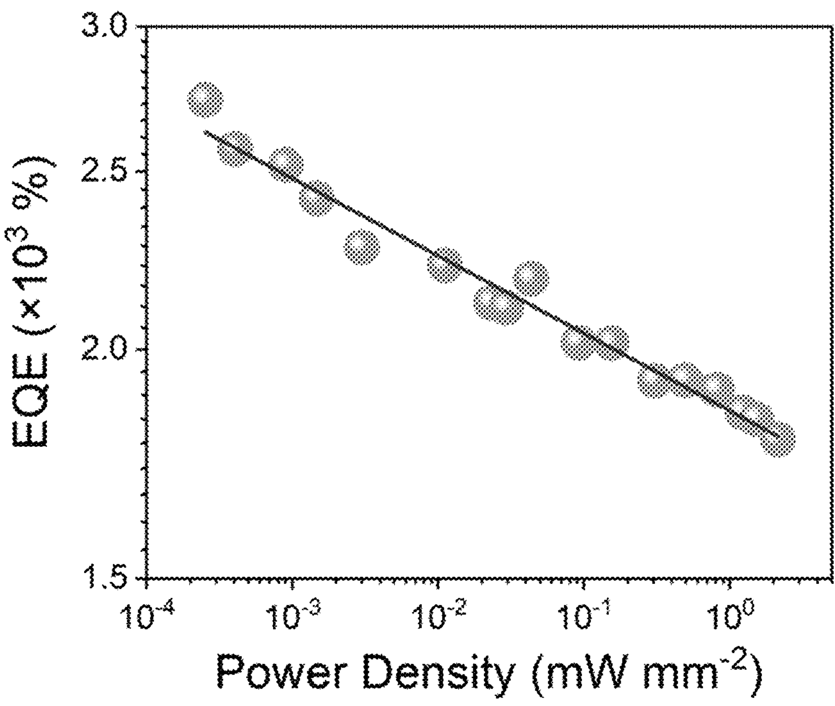
FIG. 3C is a graph of external quantum efficiency ("EQE"), in accordance with an aspect of the present disclosure.
Figure 3D:
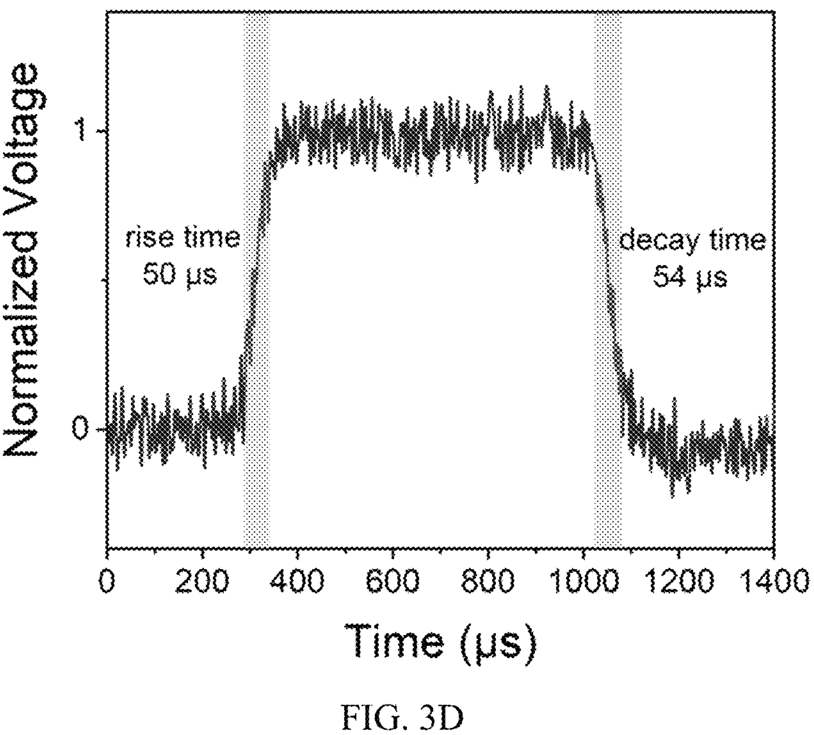
FIG. 3D is a graph of high resolution photoresponse of the anti-ambipolar phototransistor under 532 nm laser illumination, in accordance with an aspect of the present disclosure.

Generally stated, disclosed herein is a gate-tunable and anti-ambipolar phototransistor is devised based on 1D p-type gallium arsenide antimonide (GaAsSb) nanowire/2D n-type molybdenum disulfide ($MoS_2$) nanoflake mixed-dimensional van der Waals (vdW) heterojunctions. Further, methods making the phototransistors are disclosed.

Referring to the drawings, wherein like reference numerals are used to indicate like or analogous components throughout the several views, and with particular reference to FIGS. 4-7D there is illustrated a 1D GaAsSb nanowire/2D $MoS_2$ nanoflake anti-ambipolar transistor 100 and the method of fabricating the heterojunction or 1D GaAsSb nanowire/2D $MoS_2$ nanoflake anti-ambipolar transistor 100.

The transistor or mixed-dimensional heterojunction device 100 includes at least one substrate layer 102. The substrate layer 102 includes at least one layer, for example, a silicon (Si) wafer and a silicon dioxide layer ($SiO_2$) positioned over the silicon wafer. The $SiO_2$ layer may be, for example, thermally grown. The at least one nanowire 104 positioned on a portion of the at least one substrate layer 102. The nanowire 104 is, for example, a III-V compound alloy. The nanowire 104 may be, for example, a p-type, n-type, or ambipolar transistor. The nanowire 104 may be, for example, binary, ternary, or quaternary. At least one first contact 106 may be positioned over at least a portion of the at least one substrate layer 102 and at least a portion of the at least one nanowire 104. A nanoflake 108 is positioned on at least a portion of the at least one substrate layer 102 and at least a portion of the at least one nanowire 104. The nanowire 104 may be positioned beneath the at least one first contact 106 and the nanoflake 108. Alternatively, the nanowire 104 may be positioned on the at least one first contact 106 and the nanoflake 108. The at least one second contact 110 is positioned on at least a portion of the at least one substrate layer 102 and at least a portion of the nanoflake 108. In an embodiment, the nanowire 104 directly contacts the at least one first contact 106, at least a first portion of the nanoflake 108 directly contacts the at least one nanowire 104, and at least a second portion of the nanoflake 107 directly contacts the second contact 110.

With continued reference to FIGS. 4-7D, the heterojunction fabrication method includes obtaining a substrate 102 and obtaining a prepared nanowire 104. The method also includes transferring the nanowire 104 onto the substrate 102. In addition, the method includes depositing a first contact 106 over the substrate 102 and at least a portion of the nanowire 104. Further, the method includes forming nanoflake 108 over a portion of the substrate 102 and a portion of the nanowire 104. Finally, the method includes depositing a second contact 110 over the substrate 102 and at least a portion of the nanoflake 108.

Figure 4:
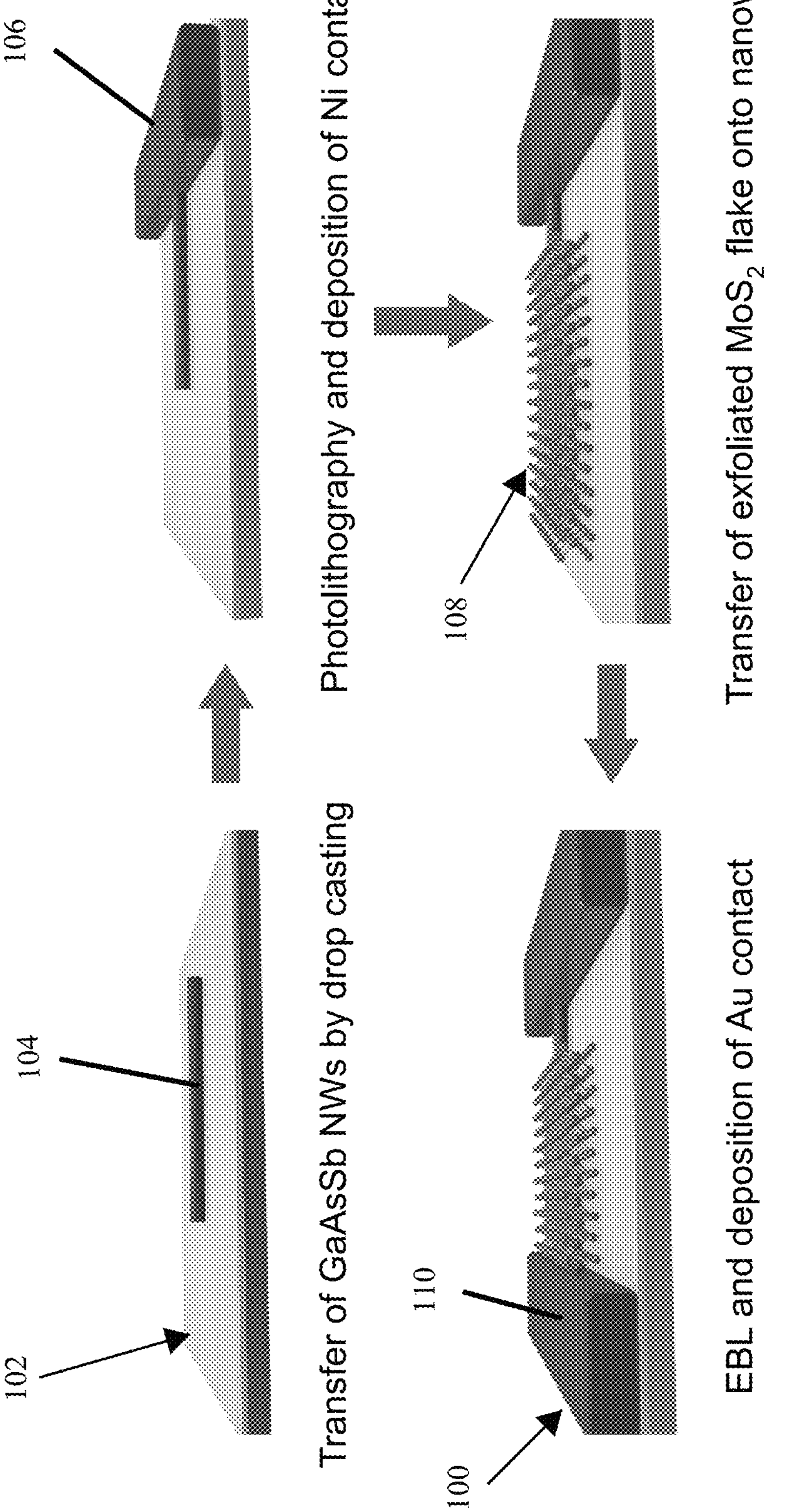
FIG. 4 is a schematic illustration of the fabrication procedures of 1D GaAsSb nanowire/2D $MoS_2$ nanoflake anti-ambipolar transistor, in accordance with an aspect of the present disclosure.

As best seen in FIG. 4 is the detailed fabrication method for the heterojunction 100. The method includes transferring the prepared GaAsSb nanowires (NWs) 104 on the $SiO_2/Si$ substrates 102 by using a dry transfer technique. The $SiO_2/Si$ substrates 102 may be, for example, approximately 270 nm thick. Next, the method includes standard photolithography and e-beam evaporation to define and deposit the nickel (Ni) contact 106. The Ni contact 106 may be, for example, 60 nm thick. The $MoS_2$ nanoflake 108 is then mechanically exfoliated by polydimethylsiloxane (PDMS) and transferred accurately onto the GaAsSb NW 104 using micromanipulation transfer system, forming the GaAsSb/$MoS_2$ vdW heterojunction 100. Then, a gold (Au) electrode 110 on top of the $MoS_2$ 100 may be patterned by electron beam lithography and thermal evaporation. The Au electrode 110 may be, for example, approximately 60 nm.

Figure 5A:
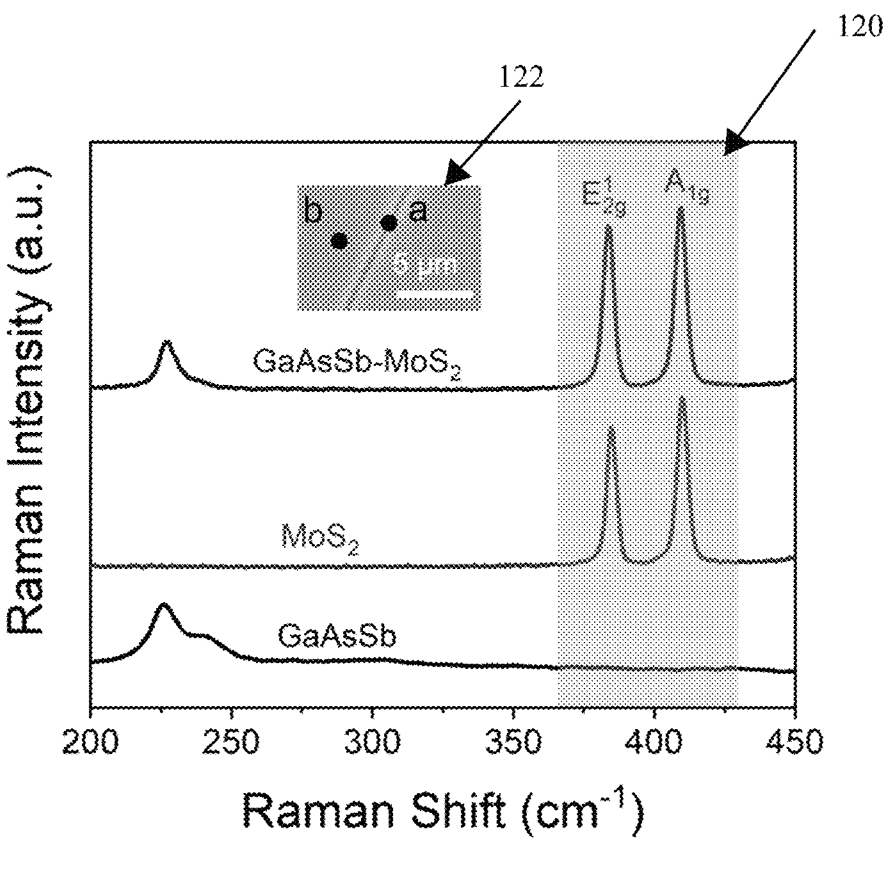
FIG. 5A is a graph of Raman spectra measured on the GaAsSb NW, $MoS_2$ nanosheet and the GaAsSb/$MoS_2$ p-n heterojunction, in accordance with an aspect of the present disclosure.
Figure 5B:
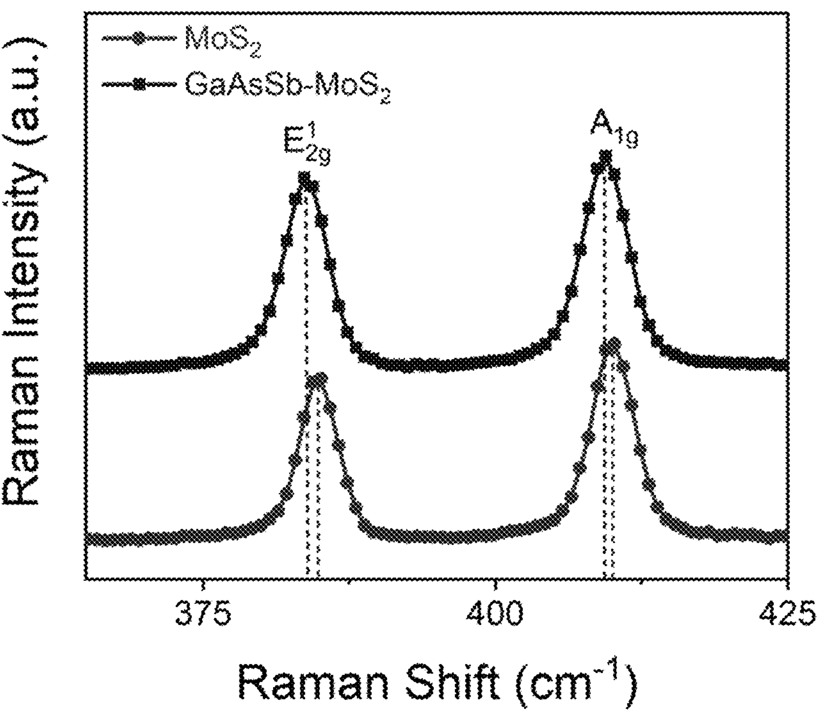
FIG. 5B is a graph comparison of the Raman spectra in the marked area of panel in FIG. 5A in detail, in accordance with an aspect of the present disclosure.

After fabrication, the coupling effect and charge transfer at interface can be verified via the optical measurements. Referring now to FIG. 5A, the Raman spectra collected from the $MoS_2$ nanosheet and the overlapped heterojunction are shown. The in-plane $$E^1_{2g}$$

(384.8 $cm^{-1}$) and out-of-plane $A_{1g}$ modes (410.2 $cm^{-1}$) are explicitly shown in the $MoS_2$ Raman spectrum measured from shaded region 120 in FIG. 5A. It can be seen that the Raman signals from the overlapped heterostructure region are a sum of the two individual signals obtained separately from the p-type GaAsSb and the n-type $MoS_2$, which confirms the formation of vertically stacked p-GaAsSb and n-$MoS_2$ heterojunction. Compared with the individual $MoS_2$ displayed in FIG. 5B, the $$E^1_{2g}$$

and $A_{1g}$ characteristic peaks in overlapped $MoS_2$ are red-shifted, implying the electron transfer from GaAsSb to the $MoS_2$ layer at the interface. Since the x-axis unit of the Raman spectrum is wavenumber ($cm^{-1}$), which is reciprocal to the wavelength, here the red-shift corresponds to the decrease in the wavenumber. Specifically, the Raman peaks of GaAsSb—$MoS_2$ shift towards left relative to those of $MoS_2$ in FIG. 5B. Hence, strong interfacial coupling is confirmed in the vdW hybrid heterojunction.

Figure 5C:
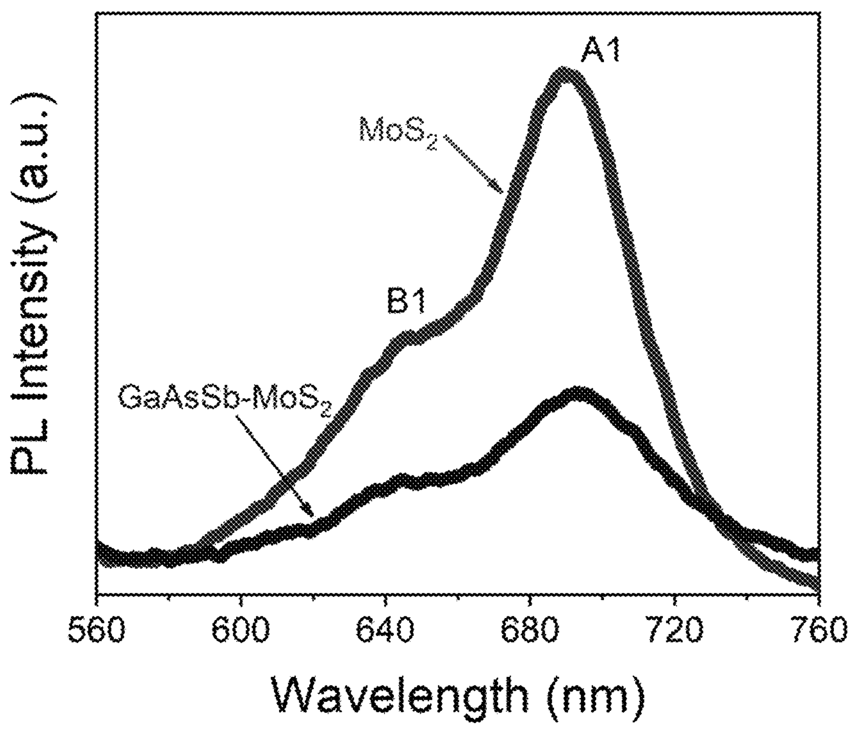
FIG. 5C is a graph of photoluminescence spectra of $MoS_2$ and GaAsSb/$MoS_2$ heterostructure, in accordance with an aspect of the present disclosure.
Figure 5D:
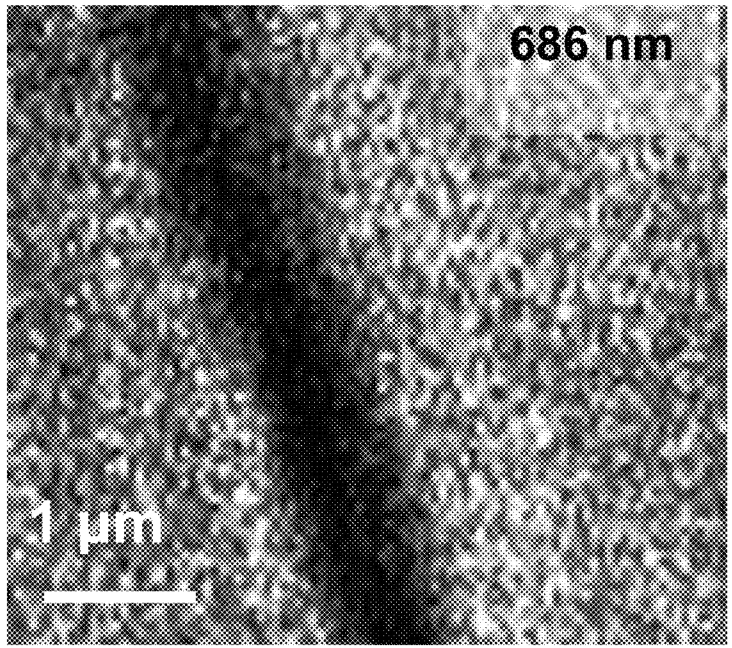
FIG. 5D is a PL mapping measured at the wavelength of 686 nm on the GaAsSb/$MoS_2$ heterostructure, in accordance with an aspect of the present disclosure.

A photoluminescence ("PL") test may be carried out using a laser with a spot diameter to further investigate the interlayer coupling effect at the GaAsSb/$MoS_2$ interface. The laser may be, for example, a 532 nm laser with a spot diameter of ~1 μm. By contrast, the photoluminescence at the overlapped region is obviously quenched for both emission peaks (acquired at the shaded region 122 in FIG. 5A). The strong suppression of photoluminescence for the $MoS_2$ segment stacked on GaAsSb NW is also apparently demonstrated from the corresponding PL mapping image in FIG. 5D. The PL mapping image may be, for example, taken at a wavelength of approximately 686 nm. In principle, the charge transfer will lead to the increased non-radiative recombination and consequently the quenched light emission from all transitions. Accordingly, the observation of reduced photoluminescence from both A1 and B1, as shown in FIG. 5C, exciton resonances indicates the efficient separation of photogenerated carriers across the heterojunction, verifying the type II GaAsSb/$MoS_2$ band alignment formed at the interface.

Figure 6A:
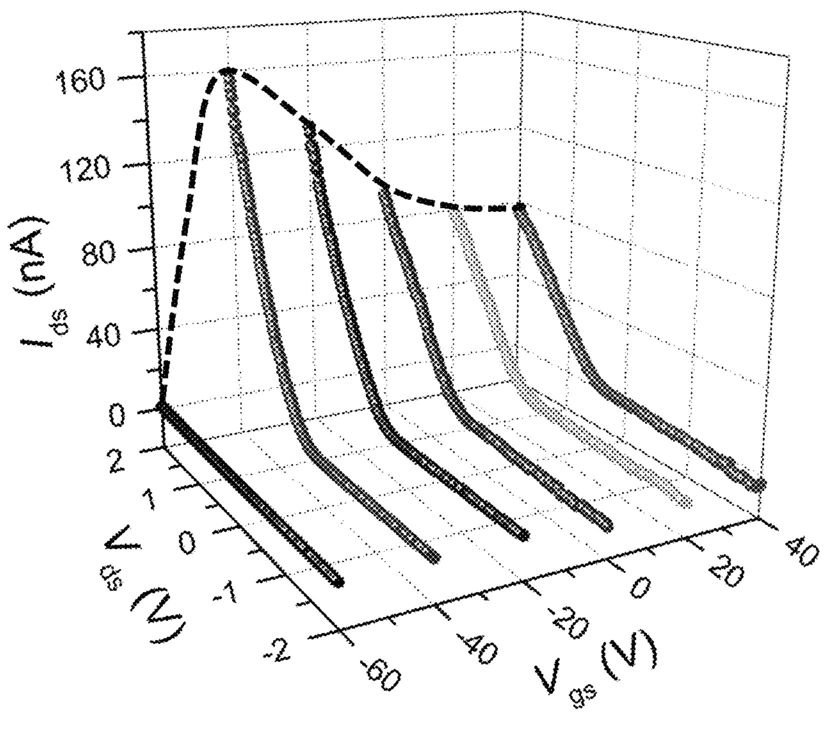
FIG. 6A is a graph of output characteristics of the GaAsSb/$MoS_2$ heterostructure device, in accordance with an aspect of the present disclosure.
Figure 6B:
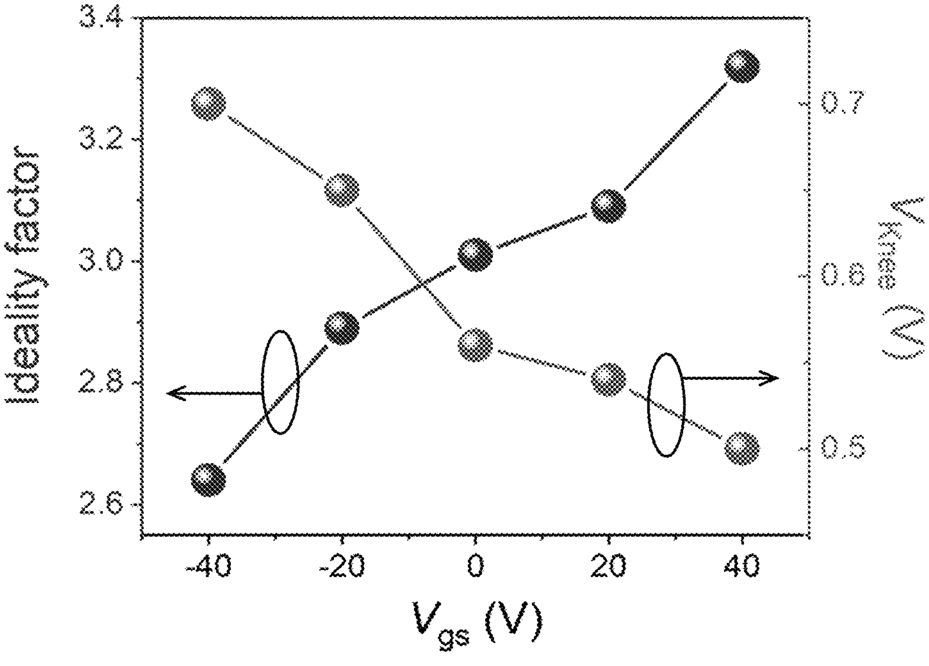
FIG. 6B is a graph of ideality factors and the knee voltage values extracted from the I-V curves shown in FIG. 6A, in accordance with an aspect of the present disclosure.

Referring now to FIGS. 6A-6B, the output curves of the GaAsSb/$MoS_2$ heterostructure device 100 could demonstrate the gate-tunability of the p-n junction as the gate bias varies from −60 V to 40 V. Concretely, the heterojunction transitions from a nearly insulating state at negative extreme of the $V_{gs}$ range to a highly rectifying output behavior at $V_{gs}$=−40 V, followed by the growing series-resistance with further increase of gate bias. The rectification ratio could, for example, be tuned from 17 to $6\times10^2$ by the electrostatic doping of $V_{gs}$ from −40 V~40 V, among which the highest value is attained at $V_{gs}$ of −40 V. In this heterojunction, the utilization of gate is then verified to have capability of tailoring the doping concentration of both semiconductors, thereby enabling tunability of built-in voltage and rectifying behavior. Furthermore, as shown in FIG. 6B and based on the I-V plots, the gate dependence of ideality factor and knee voltage ($V_{knee}$) is evaluated and compiled. With the increase of $V_{gs}$, the ideality factors witness a monoclinic ascending trend from 2.64 to 3.32, whereas a contrary tendency is observed for the knee voltage. The extracted $V_{knee}$ of 0.7 V at $V_{gs}$=−40 V is almost equal to that of the conventional Si p-n junction.

Figure 7A:
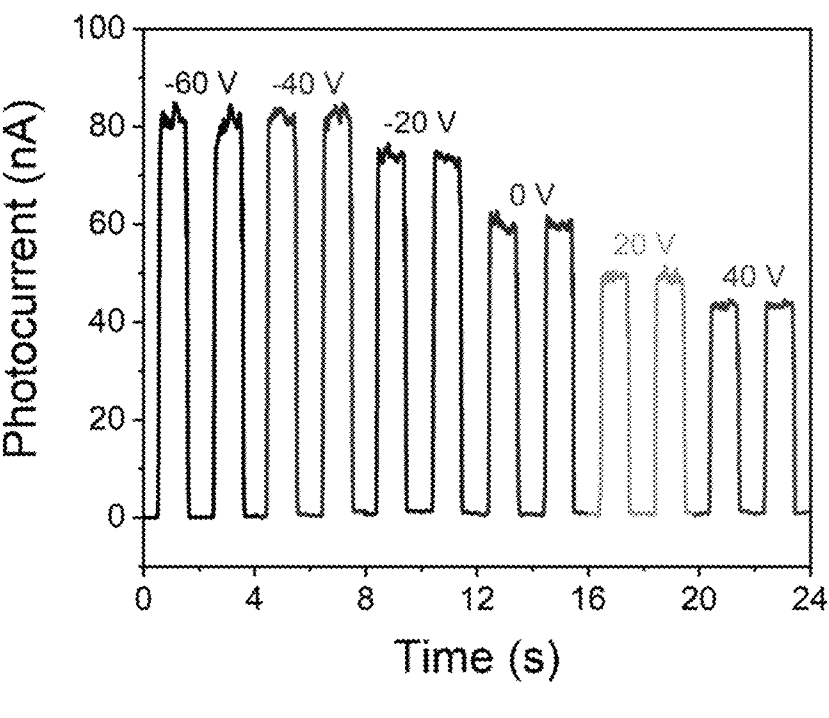
FIG. 7A is a graph of time-resolved photoresponse of the GaAsSb/$MoS_2$ heterostructure device as a function of $V_{gs}$ (532 nm light with power density of 3.62 mW $mm^{-2}$), in accordance with an aspect of the present disclosure.

The time resolved photocurrent as a function of applied back-gate voltage light illumination is shown in FIG. 7A. The light illumination may be, for example, 532 nm light illumination. In all curves, the current rises rapidly when the laser is introduced and decays promptly when the laser shutter is closed. Besides, the photocurrent increases starkly as $V_{gs}$ varies from 40 to −40 V and finally reaches a saturation at −60 V. The change in photocurrent can be attributed to the band structure adjustment in each semiconductor, which occurs in response to the external applied $V_{gs}$. An obvious decrease in the photocurrent indicates a weakened band bending or built-in voltage at the heterointerface under higher $V_{gs}$. The device structure is then verified to be capable of modulating the optoelectronic properties with gate bias.

Figure 7B:
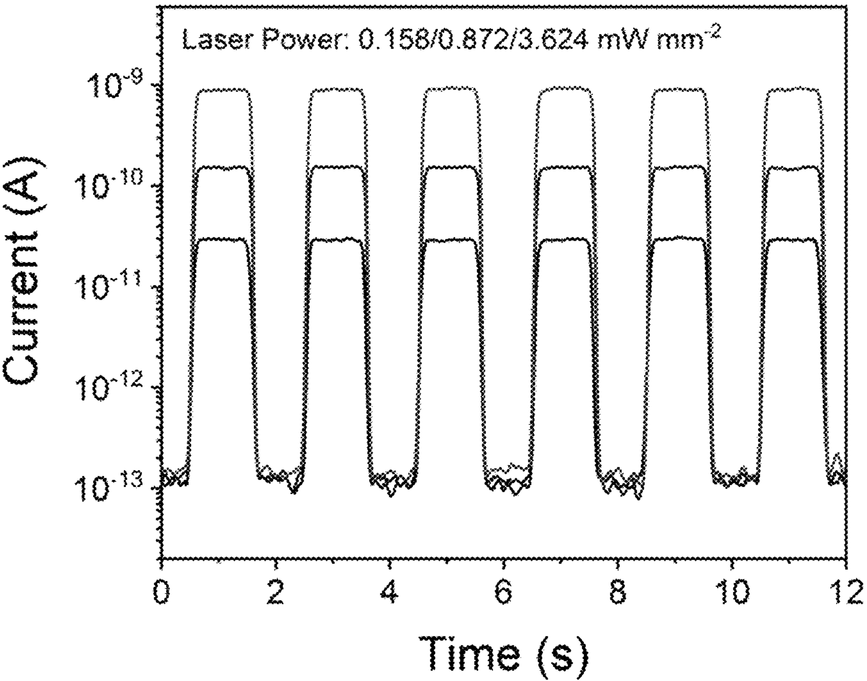
FIG. 7B is a graph showing the reproducible on/off switching under the chopped light illumination using logarithmic y-axis, in accordance with an aspect of the present disclosure.
Figure 7C:
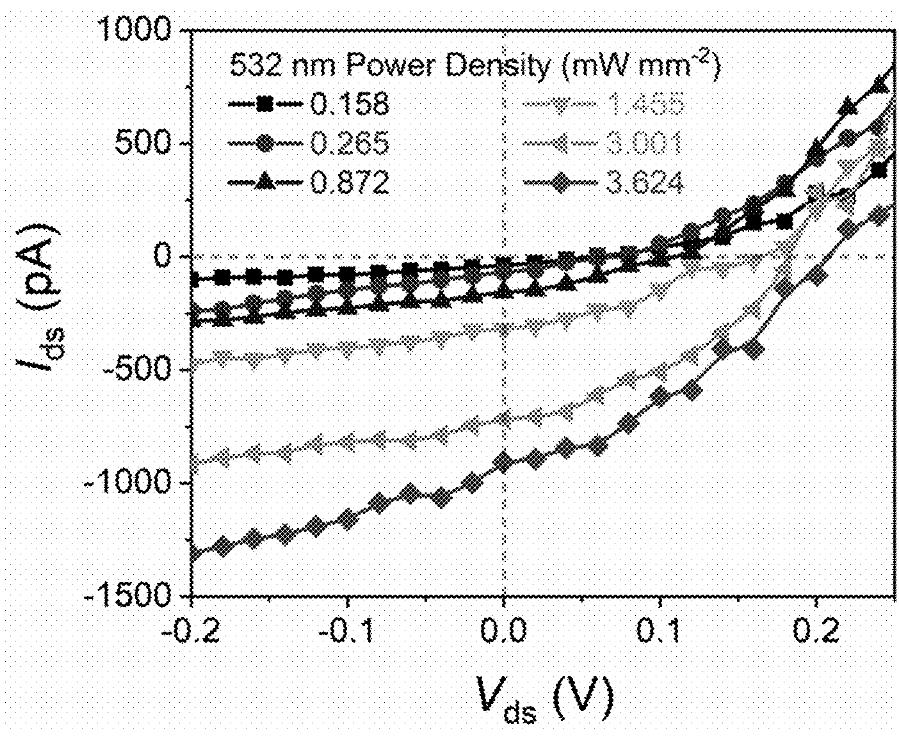
FIG. 7C is a graph of current-voltage curves from −0.2 to 0.25 V under various illumination intensities, in accordance with an aspect of the present disclosure.
Figure 7D:
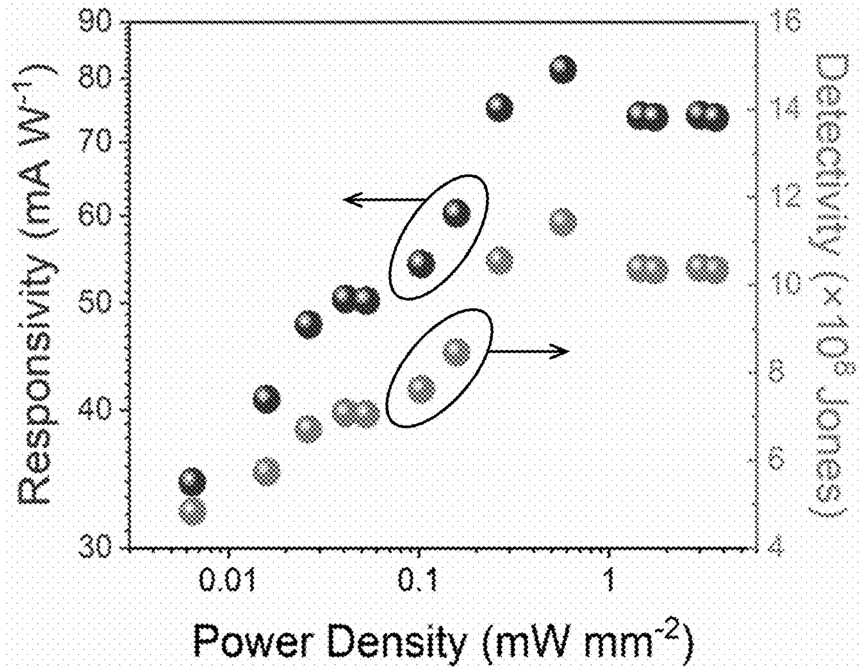
FIG. 7D is a graph of responsivity and detectivity as a function of illumination intensity, in accordance with an aspect of the present disclosure.

Referring now to FIGS. 7B-7D, the heterostructure device also shows a remarkable photovoltaic response at $V_{gs}$ of −40 V when operated at a zero source-drain bias under irradiation. The irradiation may be, for example, 532 nm. The dark current of the device is as low as ~100 fA from the reproducible on/off switching behaviors as shown in FIG. 7B, which yields a high on-off current ratio of ~$1\times10^4$ at a light intensity of 3.624 mW $mm^{-2}$. As shown in FIG. 7C, the photovoltaic effect revealed from the $V_{ds}$-$V_{ds}$ curves indicates that the open-circuit voltage ($V_{oc}$) increases gradually with light intensity and can reach up to ~0.2 V at 3.624 mW $mm^{-2}$. The extracted R and D* values are demonstrated in FIG. 7D, both of which show an overall upward trend with the increasing light intensity due to the drop of recombination rate at high power intensity. All these impressive features signify the versality of mixed-dimensional vdW heterostructures, bringing prospects for next-generation electronics and optoelectronics.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has", and "having"), "include" (and any form of include, such as "includes" and "including"), and "contain" (and any form of contain, such as "contains" and "containing") are open-ended linking verbs. As a result, a method or device that "comprises,"

"has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The invention has been described with reference to the preferred embodiments. It will be understood that the architectural and operational embodiments described herein are exemplary of a plurality of possible arrangements to provide the same general features, characteristics, and general system operation. Modifications and alterations will occur to others upon a reading and understanding of the preceding detailed description. It is intended that the invention be construed as including all such modifications and alterations.

Having thus described the preferred embodiments, the invention is now claimed to be:

1. A phototransistor based on a mixed-dimensional heterojunction device, comprising:

at least one substrate layer;

at least one nanowire positioned on a portion of the at least one substrate layer, wherein the at least one nanowire is at least one of ternary and quaternary;

at least one first contact positioned over at least a portion of the at least one substrate layer and at least a portion of the at least one nanowire;

a nanoflake positioned on at least a portion of the at least one substrate layer and at least a portion of the at least one nanowire; and at least one second contact positioned on at least a portion of the at least one substrate layer and at least a portion of the nanoflake;

wherein the phototransistor is configured to provide anti-ambipolar behavior.

2. The device of claim 1, wherein the at least one nanowire comprises:

a III-V compound alloy.

3. The device of claim 1, wherein the at least one nanowire is selected from at least one of p-type, n-type, and ambipolar.

4. The device of claim 1, wherein the at least one nanowire is positioned beneath the at least one first contact and the nanoflake.

5. The device of claim 1, wherein the at least one nanowire is positioned on the at least one first contact and the nanoflake.

6. The device of claim 1, wherein the at least one substrate layer comprises:

a doped Si wafer; and a $SiO_2$ layer positioned on the Si wafer.

7. The device of claim 6, wherein the $SiO_2$ layer is thermally grown.

8. The device of claim 1, wherein the at least one nanowire directly contacts the at least one first contact.

9. The device of claim 8, wherein at least a first portion of the nanoflake directly contacts the at least one nanowire and at least a second portion of the nanoflake directly contacts the second contact.

10. The device of claim 1, wherein the at least one nanowire is a p-type nanowire and wherein the nanoflake is a n-type nanoflake.

11. A method of forming phototransistor based on a mixed-dimensional heterojunction device comprising:

obtaining a substrate;

obtaining a prepared nanowire;

transferring the nanowire onto the substrate, wherein the nanowire is at least one of ternary and quaternary;

depositing a first contact over the substrate and at least a portion of the nanowire;

forming nanoflake over a portion of the substrate and a portion of the nanowire; and depositing a second contact over the substrate and at least a portion of the nanoflake;

wherein the phototransistor is configured to provide anti-ambipolar behavior.

12. The method of claim 11, wherein the nanowire is transferred using a dry transfer technique.

13. The method of claim 11, wherein the first contact is deposited using photolithography and e-beam evaporation.

14. The method of claim 11, wherein the nanoflake is formed by mechanically exfoliating by polydimethylsiloxane.

15. The method of claim 14, wherein the nanoflake is transferred onto the portion of the nanowire.

16. The method of claim 11, wherein the second contact is deposited by electron beam lithography and thermal evaporation.

17. The method of claim 11, wherein the substrate comprises:

a doped Si wafer; and a $SiO_2$ layer positioned on the Si wafer.

18. The method of claim 11, wherein the nanowire comprises:

a III-V compound alloy.

19. The method of claim 11, wherein the nanoflake comprises:

a 2D Van der Waals materials.

20. The method of claim 11, wherein at least one nanowire is selected from at least one of p-type, n-type, and ambipolar.

* * * * *